(12) United States Patent
Sun et al.

(10) Patent No.: US 11,616,040 B2
(45) Date of Patent: Mar. 28, 2023

(54) SEMICONDUCTOR DIES HAVING ULTRA-THIN WAFER BACKMETAL SYSTEMS, MICROELECTRONIC DEVICES CONTAINING THE SAME, AND ASSOCIATED FABRICATION METHODS

(71) Applicant: NXP USA, Inc., Austin, TX (US)

(72) Inventors: Tianwei Sun, Chandler, AZ (US); Jaynal A. Molla, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/151,356

(22) Filed: Jan. 18, 2021

(65) Prior Publication Data

US 2021/0167033 A1    Jun. 3, 2021

Related U.S. Application Data

(62) Division of application No. 16/513,246, filed on Jul. 16, 2019, now Pat. No. 10,923,451.

(51) Int. Cl.
| | |
|---|---|
| H01L 23/00 | (2006.01) |
| H03F 1/02 | (2006.01) |
| H01L 21/82 | (2006.01) |
| H01L 21/02 | (2006.01) |
| H01L 21/288 | (2006.01) |

(52) U.S. Cl.
CPC ........ *H01L 24/32* (2013.01); *H01L 21/02532* (2013.01); *H01L 21/2885* (2013.01); *H01L 21/82* (2013.01); *H01L 24/27* (2013.01); *H03F 1/0288* (2013.01); *H01L 2924/01079* (2013.01)

(58) Field of Classification Search
CPC ....... H01L 21/6835; H01L 2221/68327; H01L 2924/01079; H01L 21/82
See application file for complete search history.

(56) References Cited

U.S. PATENT DOCUMENTS

| | | | | |
|---|---|---|---|---|
| 3,654,526 A | * | 4/1972 | Cunningham | .......... H01L 24/01 257/E23.014 |
| 2015/0348921 A1 | * | 12/2015 | Ganitzer | ................. H01L 21/82 438/462 |

* cited by examiner

*Primary Examiner* — Julio J Maldonado
*Assistant Examiner* — Stanetta D Isaac (57) ABSTRACT

Semiconductor dies including ultra-thin wafer backmetal systems, microelectronic devices containing such semiconductor dies, and associated fabrication methods are disclosed. In one embodiment, a method for processing a device wafer includes obtaining a device wafer having a wafer frontside and a wafer backside opposite the wafer frontside. A wafer-level gold-based ohmic bond layer, which has a first average grain size and which is predominately composed of gold, by weight, is sputter deposited onto the wafer backside. An electroplating process is utilized to deposit a wafer-level silicon ingress-resistant plated layer over the wafer-level Au-based ohmic bond layer, while imparting the plated layer with a second average grain size exceeding the first average grain size. The device wafer is singulated to separate the device wafer into a plurality of semiconductor die each having a die frontside, an Au-based ohmic bond layer, and a silicon ingress-resistant plated layer.

20 Claims, 5 Drawing Sheets

SEMICONDUCTOR DIES HAVING ULTRA-THIN WAFER BACKMETAL SYSTEMS, MICROELECTRONIC DEVICES CONTAINING THE SAME, AND ASSOCIATED FABRICATION METHODS

CROSS-REFERENCE TO RELATED APPLICATION

This application is a divisional of co-pending U.S. patent application Ser. No. 16/513,246, filed on Jul. 16, 2019.

TECHNICAL FIELD

Embodiments of the present disclosure relate generally to microelectronics and, more particularly, to semiconductor dies having backmetal systems, microelectronic devices containing such semiconductor dies, and fabrication methods for manufacturing such semiconductor dies and microelectronic devices.

ABBREVIATIONS

Abbreviations appearing relatively infrequently in this document are defined upon initial usage, while abbreviations appearing more frequently in this document are defined below:
Ag—silver;
ASF—amp per square foot;
Au—gold;
° C.—degrees Celsius.
FET—field effect transistor;
IC—integrated circuit;
kÅ—kilo angstrom;
mils—thousands of an inch;
PA—power amplifier;
RF—radio frequency;
Si—silicon;
SiO—silicon oxide;
Ti—titanium; and
μm—microns.

BACKGROUND

Microelectronic packages often contain a substrate, a package body formed on the substrate, and at least one semiconductor die bonded to the substrate and contained within the package body. Various materials or material combinations may be utilized to attach the semiconductor die to the substrate, depending upon package requirements. In certain instances, at least one metallic layer may be formed over the backside of the semiconductor die (or dies) contained within the package (herein, a "backmetal layer") to enhance bonding with the substrate, perhaps while further promoting thermal and/or electrical communication between the packaged die (or dies) and the substrate. As a specific example, in the case of a Doherty PA package containing power RF dies bearing peaking and carrier transistor ICs, the power RF dies may be bonded to a substrate in the form of a base flange, which serves as both an electrically-conductive (e.g., ground) terminal of the package and a heat sink. In such instances, the provision of backmetal layers (or, perhaps, multi-layer systems) on the die backsides enhances metallurgical bonding, thermal transfer, and low resistance electrical conduction between the semiconductor dies, the base flange, and the die bond material utilized to attach the semiconductor dies to the base flange.

When present, a backmetal layer or multi-layer system is conveniently formed over the respective backsides of a plurality of semiconductor dies during wafer-level processing; that is, prior to wafer singulation, while the semiconductor dies remain interconnected as a device wafer. Certain techniques are conventionally utilized to globally deposit backmetal layers over the wafer backside, with such techniques often necessitating or inducing heating of the wafer to elevated temperatures exceeding 200° C. Such global deposition techniques are, however, commonly incompatible with (or provide sub-optimal results when utilized in conjunction with) the processing of ultra-thin device wafers; that is, the device wafers having a final average thickness less than 4 mils or 101.6 μm. Such ultra-thin wafers are often subject to strict thermal constraints due to, for example, the need to provide additional wafer support utilizing specialized (e.g., glass) carriers and compatible adhesives during certain wafer processing steps (e.g., wafer thinning), precluding annealing of backmetal layers or multi-layer systems at such stages of manufacture. As a further drawback, the material(s) from which backmetal layers and multi-layer systems are conventionally composed may increase electrical resistance and/or decrease thermal conductivity between the semiconductor dies and the substrates (e.g., base flanges) to which the dies are bonded. This, in turn, can result in undesirably high $R_{DS\_ON}$ values, which may negatively impact gain, efficiency, and other performance aspects in the case of Doherty PA packages and other high performance RF devices.

BRIEF DESCRIPTION OF THE DRAWINGS

At least one example of the present invention will hereinafter be described in conjunction with the following figures, wherein like numerals denote like elements, and.

For simplicity and clarity of illustration, descriptions and details of well-known features and techniques may be omitted to avoid unnecessarily obscuring the example and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following Detailed Description is merely example in nature and is not intended to limit the invention or the application and uses of the invention. As appearing herein, statements indicating that a first layer is "bonded to," is "formed over," or is "formed on" a second layer or surface (e.g., the backside of the body of a semiconductor die) do not require that the first layer is directly bonded to or intimately contacts the second layer or surface unless otherwise expressly stated. Such statements thus do not preclude the possibility that one or more intervening layers may be present between the first layer or surface and the second layer or surface. In this regard, the terms "over" and "on" do not require direct contact between a first layer formed "over" or "on" a second layer (or a named surface), unless indicated by an express statement to this effect; e.g., a statement indicating that the first layer is formed "directly on" or is formed "in contact with" the second layer (or surface). Further, the terms "over" and "on," as appearing throughout this document, are without restriction as to orientation; e.g., as an example, a first layer located beneath a second layer may be described as "formed over" the second layer when the first layer is deposited on, grown on, or otherwise created on the second layer.

Definitions

The following definitions apply throughout this document. Those terms not expressly defined here or elsewhere in this document are assigned their ordinary meaning in the relevant technical field.

Backmetal system—a multi-layer system or stack including at least two metallic layers formed over the backside of a semiconductor die.

Consisting essentially of—containing at least 99.9% of a named constituent or constituents, by weight.

Gold-based (Au-based) ohmic bond layer—a bond layer having an electrical resistivity less than 0.01 milli-Ohm millimeter at 20° C. and predominately composed of Au, by weight. In embodiments, the Au-based ohmic bond layer may consist essentially of Au (that is, contain at least 99.9% Au, by weight) and, in certain cases, may have an Au purity exceeding 99.99%, by weight.

Metallic layer—a material layer predominately composed of one or more metals, by weight. This term encompasses layers consisting essentially of one or more metals, as well as layers containing one or more metal constituents in addition to lesser amounts of non-metal constituents.

$R_{DS\_ON}$—the cumulative resistance between the source and the drain of a transistor, such as a FET, when switched on.

Silicon-based (Si-based) material—a semiconductor material predominately composed of silicon (Si), by weight.

Silicon-containing (Si-containing) backside region—a region of semiconductor die containing non-trace amounts of silicon (Si) and extending from the backside (passive side) of the die into the die body toward, but not fully to the frontside (active side) of the die.

Ultra-thin wafer—a semiconductor wafer having an average thickness less than 4 mils or 101.6 μm.

Ultra-thin wafer backmetal system—a backmetal system (defined above) formed over the body of a semiconductor die during processing of an ultra-thin wafer (also defined above) containing the die.

Overview

The following describes semiconductor dies including ultra-thin wafer backmetal systems, microelectronic devices containing such semiconductor dies, and associated fabrication methods. As indicated by the descriptor "ultra-thin wafer," the backmetal systems described herein are formed over semiconductor dies, while interconnected as an ultra-thin wafer temporarily supported by a specialized carrier (e.g., an adhesively-joined glass carrier) during wafer level processing. The ultra-thin wafer backmetal systems are capable of forming highly robust, delamination-resistant metallurgical bonds with semiconductor dies having Si-containing backside regions, such as semiconductor dies composed of partly or wholly of crystalline Si, SiC, or another Si-based material. Advantageously, the below-described ultra-thin wafer backmetal systems provide low resistance electrical conduction and efficient thermal transfer through the backmetal systems, thereby enabling low $R_{SD\_ON}$ values and enhancing the thermal performance of transistor-bearing dies (e.g., dies bearing peaking or carrier transistors ICs) when operational. As a further benefit, embodiments of the ultra-thin wafer backmetal systems can be mounted to substrates (e.g., electrically-conductive base flanges) utilizing specialized sintered materials amenable to curing (sintering) at relatively low peak processing temperatures, such as temperatures less than 300° C. and, perhaps, less than or equal to 250° C. Such sintered materials are usefully employed to form bonds between the substrate and the backmetal system characterized by highly favorable metallurgical, electrical, and thermal conduction properties, as further discussed below.

Embodiments of the backmetal systems include Au-based ohmic bond layers, which are sputter deposited onto the respective backsides (and, therefore, the Si-containing backside regions) of semiconductor dies when interconnected as an ultra-thin device wafer. As indicated by the term "Au-based," the Au-based ohmic bond layers are predominately composed of Au, by weight, and may consistent essentially of Au in many instances. As further indicated by the term "ohmic," the Au-based ohmic bond layers provide low resistance electrical conduction across the interface between the bond layers and the die backsides. Concurrently, the Au-based ohmic bond layers provide excellent thermal conductivity across this interface, while forming high strength, delamination-resistant metallurgical bonds with the Si-containing backside regions of semiconductor dies. The formation of the high strength metallurgical bonds is achieved, at least in part, by tightly controlling certain process parameters during the sputter deposition process. The duration and energy input of the sputtering process, in particular, may be controlled within certain predetermined bounds to limit heat input to relatively localized regions of the wafer, while promoting diffusion of the deposited Au-based material into the backside region of the device wafer and, therefore, the respective Si-containing backside regions of the dies contained within the wafer. Such parameters may be controlled, at least in part, by limiting the Au-based ohmic bond layer to a specific thickness range (e.g., from about 1 to about 10 kÅ) in certain embodiments and subject to the deposition rate of the sputter deposition process employed. Additional description of the Au-based ohmic bond layer, and sputter deposition processes suitable for depositing the Au-based ohmic bond layer, is set-forth below.

As just stated, through the performance of a carefully-controlled sputter deposition process, Au-based ohmic bond layers can be deposited over the Si-containing backside regions of a plurality of semiconductor dies interconnected as a device wafer, while forming low electrical resistance, high thermal conductivity, delamination-resistant metallurgical bonds with the semiconductor dies. A secondary technical issue arises, however, in instances in which the semiconductor dies subsequently cleaved from the wafer are desirably attached to substrates utilizing (e.g., sintered) die bond materials cured at elevated temperatures approaching or exceeding 200° C. At such elevated temperatures, there exists a propensity for Si within the Si-containing backside regions of the semiconductor dies to migrate through the Au-based ohmic bond layer, react with ambient oxygen, and generate undesirable byproducts, such as silicon oxides (SiO) including, but not limited to, silicon dioxide ($SiO_2$). Consequently, when attaching a particular semiconductor die to a base flange or other substrate, a relatively thin SiO layer may develop at the interface between the (e.g., sintered) die bond layer and the Au-based ohmic bond layer. Such an SiO layer may reduce bond integrity, increase electrical resistance, and lessen thermal conductivity between the semiconductor die and the substrate. This may, in turn, greatly reduce the thermal and electrical performance of a Doherty PA packages and other high performance RF device into which the semiconductor die and substrate are ultimately incorporated.

Certain solutions or mitigation steps may be attempted to prevent or deter the growth of SiO during the die attach process. It is, of course, possible to perform the die attach process in a processing chamber containing a non-oxidizing atmosphere or a partial vacuum. In actual practice, however, it is generally impractical to remove a sufficient volume of oxygen from the processing chamber to adequately prevent the SiO formation during the die attach process. Another potential solution involves the deposition of a Ti-containing barrier layer, such as a Ti-nickel-vanadium-Au (TiNiVAu) barrier layer, over the Au-based ohmic bond layer. Beneficially, such a Ti-containing barrier layer may block Si species migrating through the Au-based ohmic bond layer from reaching the interface with the die bond material and forming SiO at this juncture. However, the provision of such a Ti-containing barrier layer adds cost and complexity to fabrication; and, more importantly, typically results in an undesirable increase in the electrical resistivity between the semiconductor die and its underlying substrate. A still further potential solution arises from the present observation that Si migration through the Au-based ohmic bond layer is facilitated due, in large part, to the fine grain morphology of the sputtered Au-based material; and, specifically, due to the ample grain boundaries present in the fine grain morphology through which Si species readily pass under elevated temperature conditions. Thus, as a further potential solution, annealing could potentially be performed to increase the grain size of the Au-based ohmic bond layer following the sputter deposition process, thereby rendering the Au-based ohmic bond layer increasingly resistant to Si ingress. However, once again, annealing is typically performed at highly elevated temperatures (e.g., temperatures approaching or exceeding 350° C.); and is thus desirably avoided in the context of temperature-limited ultra-thin wafer process flows.

The instant teachings further offer a solution to this secondary technical problem (Si ingress through the Au-based ohmic bond layer during the die attach process) through the formation of unique multi-layer backmetal systems over the die backsides during wafer-level processing. The multi-layer backmetal systems are each produced to contain not only the previously-mentioned Au-based ohmic bond layer, but to further include an Si ingress-resistant plated layer formed over (e.g., electroplated directly on) the ohmic bond layer. Further, as indicated by the term "Si ingress-resistant," the electroplating process utilized to deposit the Si ingress-resistant plated layer is a controlled in a manner imparting the plated layer with an increased resistance to Si ingress relative to the Au-based ohmic bond layer. More specifically, current densities and other operational aspects of the electroplating process are controlled in a manner imparting the Si ingress-resistant plated layer with an average grain size exceeding (e.g., at least twice and, perhaps, at least ten times) the average grain size of the Au-based ohmic bond layer. By reducing grain boundaries within the plated layer, such a large grain morphology imparts the Si ingress-resistant plated layer with an increased resistance to Si migration during the die attach process. This, in turn, reduces or eliminates the formation of SiO at the interface with the die bond material during the subsequently-performed die attach process. In embodiments, the Si ingress-resistant plated layer may be predominately composed of Au, Ag, palladium (Pd), platinum (Pt), or any combination thereof, by weight; and, in one specific implementation, the Si ingress-resistant plated layer is predominately composed of Au, by weight, while containing a lesser amount of Au than does the Au-based ohmic bond layer.

After formation of the backmetal systems over the semiconductor dies making-up the device wafer, the ultra-thin device wafer is singulated to yield a plurality of individual semiconductor dies, each having a backmetal system formed thereover. Each die may then be mounted to a substrate, such as a printed circuit board (PCB) or an electrically-conductive base flange, at a subsequent juncture in time. Various different bond materials, including solder and electrically-conductive die attach materials (e.g., metal particle-filled epoxies), can be utilized to attach a given semiconductor die to a given substrate. However, as indicated briefly above and as described more fully below, certain notable benefits may be achieved through the usage of a sintered material bond amenable to curing (sintering) at relatively low temperatures, such as temperatures less than 300° C. In this case, a low temperature sinter attachment process may be employed during which the outermost layer of the backmetal system (e.g., the Si ingress-resistant plated layer) is placed in contact with a sinter precursor material; with the sinter precursor material further contacting the upper surface of the selected substrate, such as the plated or bare upper surface of an electrically-conductive base flange.

The sinter precursor material may then be cured (e.g., by exposure to elevated temperatures in accordance with a predetermined heating schedule) to a maximum processing temperature (e.g., a temperature less than 300° C. and, perhaps, less than or equal 250° C.) to convert the sinter precursor material to a sintered bond layer. This results in the formation of a highly robust metallurgical bond between the upper surface of the base flange and the Si ingress-resistant plated layer. Ultimately, then, the semiconductor die is mounted to the base flange in a manner providing high strength, delamination resistant bonds throughout the material stack between the die and the base flange, while further providing a low resistance electrical path and a highly conductivity thermal path between the die and the base flange. The thermal and electrical performance aspects (e.g., $R_{DS\_ON}$ values) of the resulting microelectronic device may be optimized as a result Additional description of examples of semiconductor dies having backmetal systems, microelectronic devices incorporating such semiconductor dies, and fabrication methods will now be provided in connection with FIGS. 1-13.

Figure 1:
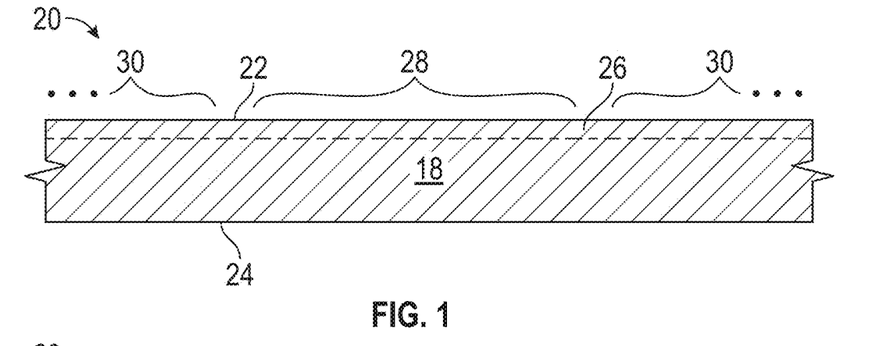
FIGS. 1-7 are simplified cross-sectional views of a device wafer (partially shown) processed to produce ultra-thin wafer backmetal systems over the semiconductor dies contained in the wafer, as depicted at various stages of pre-singulation fabrication and illustrated in accordance with an example embodiment of the present disclosure.

Microelectronic Devices Including Ultra-Thin Wafer Backmetal Systems and Methods for the Fabrication Thereof FIG. 1 is a simplified cross-sectional view of a limited portion of a device wafer 20, as illustrated prior to thinning in accordance with an example embodiment of the present disclosure. The device wafer 20 has a wafer frontside 22, a wafer backside 24, and a frontside active region 26 across which a number of ICs are formed. The device wafer 20 contains a plurality of semiconductor die 28, 30, which are physically interconnected to form the wafer 20 and subsequently separated into individual units during wafer singulation, as described below in connection with FIGS. 7 and 8. For illustrative clarity, only a few semiconductor dies 28, 30 are included in the limited region of the device wafer 20 shown in FIG. 1 and further shown in FIGS. 2-8, discussed below. Specifically, a single, centrally-depicted semiconductor die 28 is shown in its entirety, while adjacent portions of two neighboring semiconductor dies 30 are also shown. For ease of discussion, the following discusses the processing of the device wafer 20, while principally focusing on the centrally-depicted semiconductor die 28. It will be appreciated, however, that the teachings below apply equally to the other semiconductor dies 30 (including those dies 30 not shown in FIGS. 1-8) contained in the device wafer 20 and processed in parallel to manufacture a plurality of semiconductor die 28, 30, each having a backmetal system formed thereon.

At the early stage of manufacture shown in FIG. 1, and as previously noted, a plurality of ICs has been formed in the frontside active region 26 of the device wafer 20. The active frontside region 26 generally extends from the wafer frontside 24 into the body of the wafer 20 by some depth, terminating prior to reaching the below-described wafer backside region 18. The particular spatial distribution or planform layout of the ICs formed in the frontside active region 26 of the device wafer 20 will vary among embodiments. Typically, at least one IC is formed in the wafer frontside 22 at a location corresponding to each of the semiconductor dies 28, 30 contained within the wafer 20. The particular type of ICs (or types of ICs) formed across the wafer frontside 22 will also vary between embodiments. In one embodiment, by way of non-limiting example only, some or all of the ICs formed across the wafer frontside 22 in the active frontside region 26 may each include either a peaking or carrier FET (or other transistor) in embodiments in which the semiconductor die 28, 30 are power RF die of the type incorporated into a Doherty PA device, such as the example Doherty PA package described below in connection with FIGS. 12 and 13.

The device wafer 20 may also be described as having a passive wafer backside region 18, which generally extends from the wafer backside 24 into the body of the wafer 20 toward the wafer frontside region 26 by some depth. The wafer backside region 18 may be composed of a Si-containing material; and, in embodiments, may be composed of a Si-based material, such as crystalline Si or SiC. The remainder of the device wafer 20 can be composed of the same material or a similar material as is the wafer backside region 18. Alternatively, the reminder of the device wafer 20 can be composed of another semiconductor material, semiconductor material compound, or material combination. In this regard, in embodiments in which a plurality of transistor ICs (e.g., peaking or carrier transistor ICs) is formed across the wafer frontside region 26, the transistor ICs can be implemented as Si-based FETs, such as laterally-diffused metal oxide semiconductor (LDMOS) FETs. Alternatively, as another example, the transistor ICS may be implemented utilizing III-V semiconductor materials, such as gallium nitride (GaN), gallium arsenide (GaAs), GaP (gallium phosphide), an indium phosphide (InP), or indium antimonide (InSb). Various other material or material combinations in which ICs are suitably formed, whether including FETs, other transistors, or other circuit elements, can equivalently be utilized in further implementations.

Figure 2:
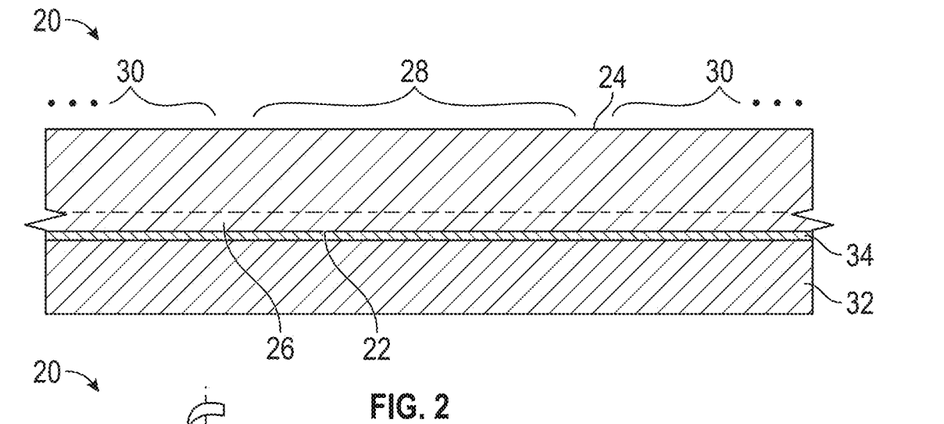
Figure 3:
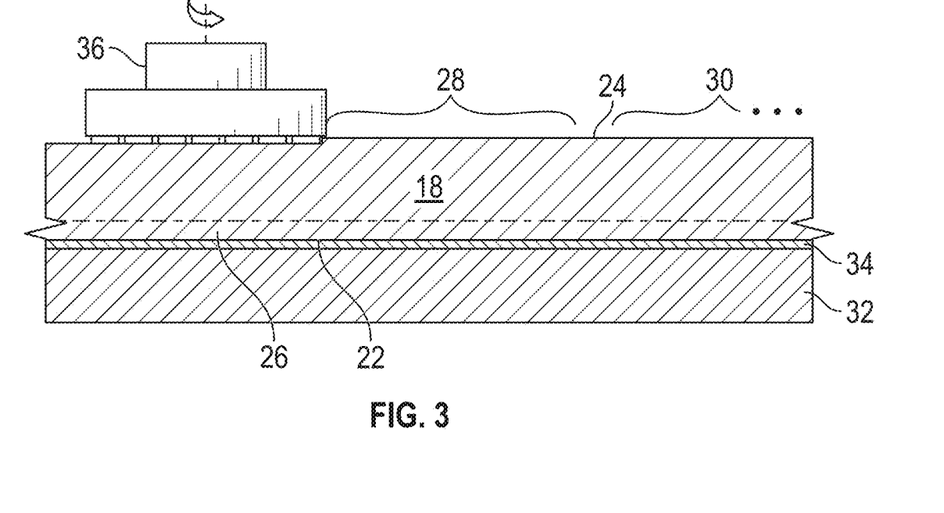
Figure 4:
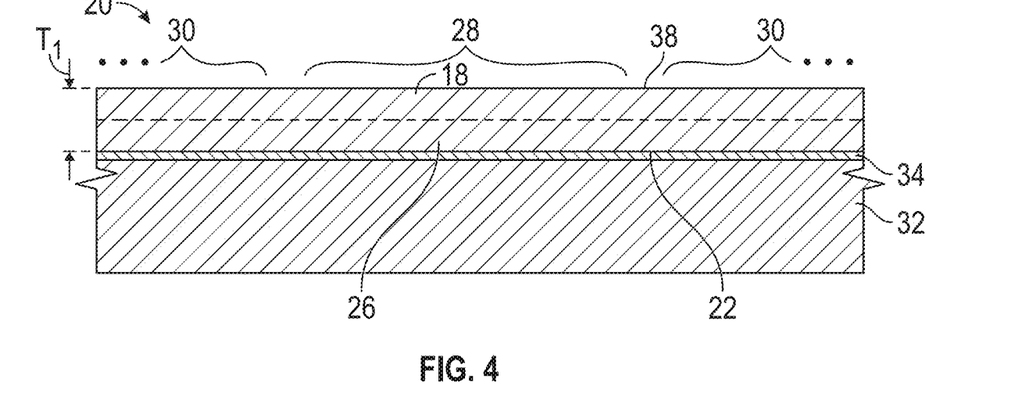

Referring now to FIG. 2, after IC formation in the wafer frontside region 26, the device wafer 20 is inverted and attached to a glass (or other) carrier 32 utilizing, for example, a temporary adhesive layer 34. Now supported, the device wafer 20 can be thinned by grinding, lapping, polishing (e.g., chemical mechanical polishing), or any combination thereof to a desired final thickness. Indicating this, a rotating tool 36, here a grinding wheel, is shown in FIG. 3 as removing material from the backside 24 of the device wafer 20 to bring the wafer 20 to the desired final thickness. The thickness removed from the device wafer 20 will vary among embodiments, as will the final average thickness of the wafer 20. The device wafer 20 is illustrated after thinning in FIG. 4 as having a final average thickness of $T_1$, which is less than 4 mils (101.6 µm). Thinning of the device wafer 20 reveals a new (thinned or ground) backside surface, as identified in FIG. 4 reference numeral 38.

As just stated, sufficient material is removed from the device wafer 20 to impart wafer 20 with a final average thickness (Ti) less than 4 mils (101.6 µm). Considering this, the device wafer 20 may be properly considered an "ultra-thin" wafer and will consequently be referred to as "ultra-thin device wafer 20" hereafter. In many instances, wafer thinning will be performed to bring the value of $T_1$ well below 4 mils, perhaps, to a value of approximately 3 mils, approximately 1.6 mils, or thinner. Due to its newly-thinned structure, the ultra-thin device wafer 20 may now be prone to warpage or breakage if not properly supported by the glass carrier 32 and the temporary adhesive layer 34 during subsequent processing steps. Notably, the glass carrier 32 (and, perhaps, the temporary adhesive layer 34) may be associated with certain, relatively restrictive temperature limitations precluding or discouraging heating above a maximum temperature threshold of, for example, approximately 200° C. For example, embodiments of the glass carrier 32 may be incapable of withstanding temperatures above this critical threshold (e.g., 200° C.) thereby preventing annealing of any backmetal layer or multi-layer system, while the device wafer 20 remains attached to the glass carrier 32. Further, this critical temperature is well-below the peak processing temperatures at which traditional die attach processes are performed, such as Au—Si eutectic attachment processes involving heating to temperatures exceeding about 380° C. If heated above the maximum temperature threshold, delamination from the glass carrier 32 (or other structural compromise of the glass carrier 32) may occur resulting in potential warpage or other damage of the ultra-thin device wafer 20.

Figure 5:
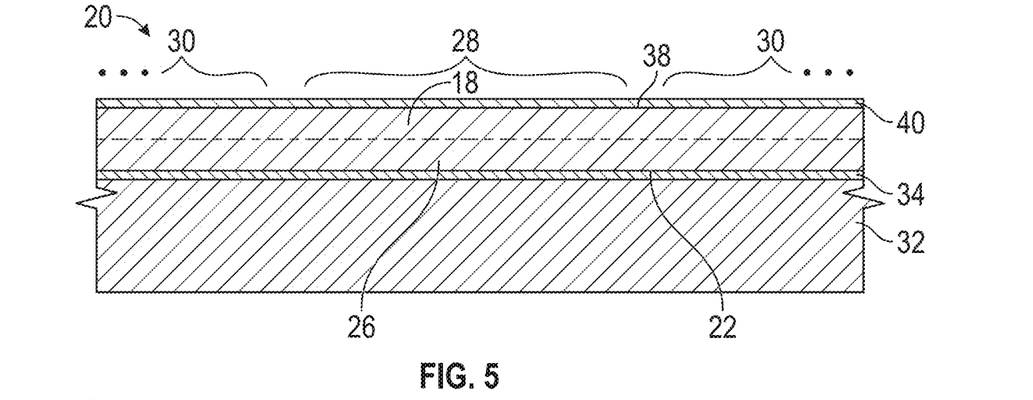

Next, a global or "wafer-level" Au-based ohmic bond layer 40 is sputter deposited onto the backside 38 of the ultra-thin device wafer 20 and, therefore, onto the respective backsides of a plurality of semiconductor die 28, 30 contained within the device wafer 20. Advantageously, the wafer-level Au-based ohmic bond layer 40 may be deposited to form a high strength, delamination-resistant metallurgical bond with the backside 38 of the ultra-thin device wafer 20 and the dies 28, 30 contained therein. In particular, the duration and energy input of the sputtering process utilized to deposit the ohmic bond layer 40 may be controlled in a careful, predetermined manner to limit heat input and spread, while promoting the diffusion of the deposited Au-based material into the backside region of the ultra-thin device wafer 20 and the respective backside regions of the dies 28, 30 making-up the device wafer 20. At the deposition rates associated with traditional sputter deposition processes, this may entail that the wafer-level Au-based ohmic bond layer 40 is deposited to a predetermined minimum thickness bounding this predetermined range. The minimum thickness of this range may exceed 1 kÅ to allow sufficient energy input to achieve the desired metallurgical (e.g., diffusion) bond. Concurrently, the maximum thickness bounding the predetermined thickness range may be set at, for example, 10 kÅ. It has been found that thicknesses exceeding 10 kÅ provide little, if any additional benefit in promoting bond integrity between the Au-based ohmic bond layer 40 and the ultra-thin device wafer 20, instead serving only to increase material costs. Consequently, the wafer-level Au-based ohmic bond layer 40 may be advantageously deposited to an average thickness ranging from 1 to 10 kÅ and, more preferably (due to optimal bonding without excessive Au usage), ranging about 3 and about 5 kÅ in embodiments.

In other embodiments, the thickness of the wafer-level Au-based ohmic bond layer 40 may vary relative to the above-specified ranges. For example, in certain instances, additional energy input may be applied to the deposited material during the sputtering process (e.g., through the performance of a "hot" sputtering technique) thereby allowing the achievement of a high strength diffusion bond at layer thicknesses in the lower end of the above-specified ranges and, perhaps, at layer thickness near and possibly less than 1 kÅ. As the average thickness of the wafer-level Au-based ohmic bond layer 40 will vary among embodiments, so too will the composition of the Au-based ohmic bond layer 40 (providing that the Au-based ohmic bond layer 40 is predominately composed of Au by weight). This stated, the wafer-level Au-based ohmic bond layer 40 is usefully deposited to consist essentially of Au (that is, have an Au of at least 99.9%, by weight) and may have a purity exceeding 99.99%, by weight, in at least some embodiments of the present disclosure.

Figure 6:
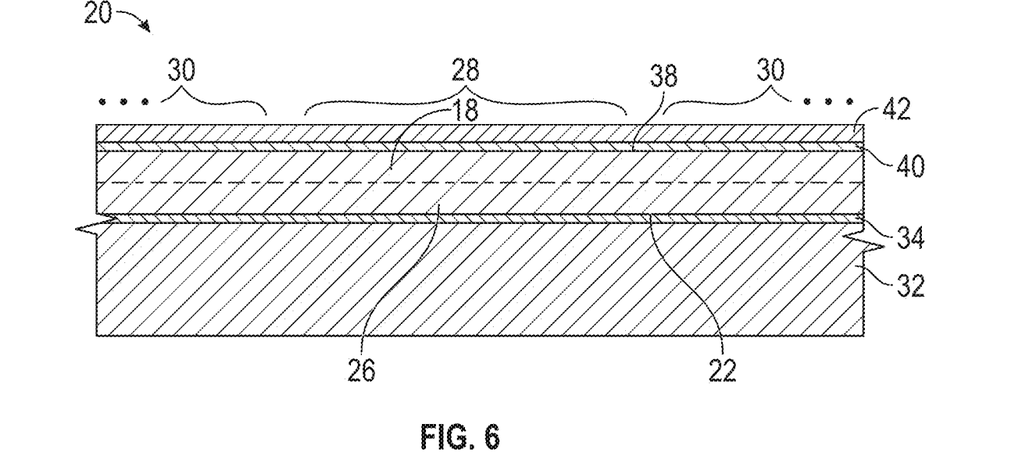

Progressing to FIG. 6, a wafer-level Si ingress-resistant plated layer 42 is next formed over the wafer-level Au-based ohmic bond layer and cooperates therewith to create a multi-layer, wafer-level backmetal system 40, 42. The wafer-level Si ingress-resistant plated layer 42 is formed utilizing an electroplating process, which is adapted to impart the plated layer 42 with an increased resistance to Si ingress relative to the wafer-level Au-based ohmic bond layer 40. In this regard, the electroplating process is controlled to impart the wafer-level Si ingress-resistant plated layer 42 with an average grain size exceeding the average grain size of the wafer-level Au-based ohmic bond layer 40; e.g., the Si ingress-resistant plated layer 42 may have an average grain size at least twice and, perhaps, at least ten times that of the wafer-level Au-based ohmic bond layer 40 in embodiments. Further, in certain implementations, the grain size of the wafer-level Au-based ohmic bond layer 40 may range from about 0.07 µm to about 0.33 µm, while the grain size of the wafer-level Si ingress-resistant plated layer 42 ranges from about 1.2 µm to about 3.5 µm. In other embodiments, the grain size of the layers 40, 42 may be greater than or less than the aforementioned range. Imparting the wafer-level Si ingress-resistant plated layer 42 with such a relatively large grain morphology reduces the grain boundaries within the plated layer 42 and, therefore, the avenues by which Si can migrate from the Si-containing die backside regions 18' through the plated layer 42 drive SiO formation during the below-described die attach process. As an additional benefit, imparting the wafer-level Si ingress-resistant plated layer 42 with a relatively large grain size may also improve electrical conductivity by lessening any scattering effect created by a fine grain morphology.

The above-described large grain morphology may be achieved through tuning or tailoring certain key parameters during the electroplating process; e.g., relatively low current densities may be applied, such current densities ranging from about 0.5 to about 3.5 ASF (about 5.4 to about 37.7 amp per square meter) or, perhaps, ranging from about 1.0 to about 2.0 ASF (about 10.7 to about 21.5 amp per square meter), during the electroplating process. Notably, such current densities are often considerably less than those employed in conventional electroplating processes (as utilized in this context) as such low current densities increase process duration and yield relatively unaesthetic, dull plated layers. Further, the plating bath chemistry may be formulated to lack commonly-included grain refiners and/or otherwise be varied, as appropriate, to promote large grain material deposit. So too may other process parameters (e.g., temperature and agitation levels) be controlled to promote large grain growth during the electroplating process.

With continued reference to FIG. 6, the wafer-level Si ingress-resistant plated layer 42 may be deposited to an average thickness exceeding that of the wafer-level Au-based ohmic bond layer 40 in embodiments; such thicknesses measured along axes orthogonal to the backsides of the wafer 20 or dies 28, 30. Additionally or alternatively, the average thickness of the Si ingress-resistant plated layer 42 may range from about 5 to about 20 kÅ in embodiments; although the Si ingress-resistant plated layer 42 may be thicker or thinner than the aforementioned range in other instances. The composition of the wafer-level Si ingress-resistant plated layer 42 can and will vary among embodiments, providing that the selected material is amenable to deposition by electroplating onto the wafer-level Au-based ohmic bond layer 40, possess an adequately low electrical resistivity, and exhibits a higher resistance to Si ingress during high temperature exposure than does the ohmic bond layer 40. In certain implementations, the wafer-level Si ingress-resistant plated layer 42 may be predominately composed of one or more of the following metallic constituents, by weight: Au, Ag, Pd, and Pt. In other implementations, the wafer-level Si ingress-resistant plated layer 42 may be predominately composed of Au, by weight, but may contain a lesser amount of Au (that is, have a lower Au purity) than does the wafer-level Au-based ohmic bond layer 40.

As just described, the wafer-level Si ingress-resistant plated layer 42 is electroplated over or on the wafer-level Au-based ohmic bond layer 40 in embodiments of the backmetal system 40, 42. As appearing in this context, the terms "over" and "on" are utilized interchangeably to indicate that a first named element or layer (e.g., the Si ingress-resistant plated layer 42) is formed (e.g., by electroplating) in a bonded relationship with a second named element layer (e.g., the Au-based ohmic bond layer 40), with the first and second layers at least partially overlapping as taken along an axis orthogonal to the principal surfaces of the layers. The terms "over" and "on" therefore do not require direct physical contact between the named elements or layers, thus leaving open the possibility that one or more intervening layers may be provided between the first and second named layers. Conversely, statements indicating that the two layers contact or that the first layer is formed (e.g., electroplated) "directly on" the second layer require intimate contact between the first and second layers. In keeping with the foregoing description, the Si ingress-resistant plated layer will often be formed directly on and in contact with the Au-based ohmic bond layer 40; however, the possibility that certain other layers, such as a titanium-tungsten (TiW) barrier layer, may be formed between the Si ingress-resistant plated layer 42 and the Au-based ohmic bond layer 40 (e.g., for enhanced Si-ingress resistance with a tradeoff in lower electrical conductivity) is not precluded.

Continuing the discussion from the previous paragraph, in certain embodiments, the ultra-thin wafer backmetal system 40, 42 may include additional layers, such as a Ti-containing barrier layer (e.g., a TiNiVAu barrier layer) for increased Si ingress, but with a tradeoff in lower electrical conductivity. In other instances, and as indicated in FIGS. 6-13, the ultra-thin wafer backmetal system 40, 42 may consist entirely of the wafer-level Au-based ohmic bond layer 40 and the wafer-level Si ingress-resistant plated layer 42. In this latter case, the Au-based ohmic contact layer 40 may first be sputter-deposited directly onto the backside of the device wafer 20, followed by electroplating of the Si ingress-resistant plated layer 42 directly onto the Au-based ohmic contact layer 40. Further, in such embodiments, the ultra-thin wafer backmetal system 40, 42 may be essentially free of Cr, Ti, W, Ni, and V; the term "essentially free," as appearing herein, defined as contain less than 0.1% of a named constituent or constituents, by weight.

Figure 7:
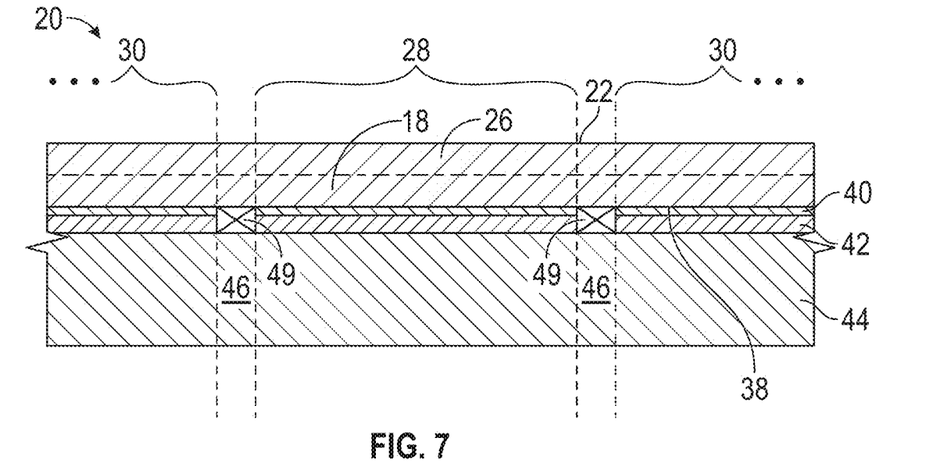

After formation of the wafer-level backmetal system 40, 42, the ultra-thin device wafer 20 may be further processed, if needed, and then singulated to separate the semiconductor dies 28, 30 into discrete units. In preparation for singulation, the ultra-thin device wafer 20 may be detached from the glass carrier 32, inverted, and then mounted to another temporary substrate, such as a relatively thick layer of dicing tape 44, as shown in FIG. 7. Referring to FIG. 7 in conjunction with FIG. 8, wafer singulation may then be accomplished utilizing sawing, scribing, laser cutting, or another suitable process. For example, in one approach, a dicing saw (e.g., a water-cooled diamond saw) is directed through saw lanes 46 (FIG. 7) to remove material from wafer kerf regions 48 (FIG. 8) and thereby separate the dies 28, 30. Further, as generically indicated in FIG. 7 by symbols 49, regions of the wafer-level Si ingress-resistant plated layer 42 and, perhaps, underlying regions of the wafer-level Au-based ohmic bond layer 40 encompassed by the saw lanes 46 may be removed (or not formed) to facilitate the singulation process; e.g., to reduce saw wear and/or to minimize the generation of debris, particularly if singulation is accomplished by dicing. For example, in one approach, the wafer-level Au-based ohmic bond layer 40 may be formed globally across the ultra-thin device wafer 20; that is, formed such that the ohmic bond layer 40 generally extends from edge to edge of the wafer 20. Subsequently, selected regions of the Au-based ohmic bond layer 40 may be masked prior to the electroplating process by which the Si ingress-resistant plated layer 42 is deposited. This results in the creation of voids or openings within the Si ingress-resistant plated layer 42, with the location of such voids generally corresponding to the saw lanes 46 identified in FIG. 7. The masking material may then be chemically stripped or otherwise removed ahead of the dicing process; or, instead, left intact and removed as part of the dicing process.

Figure 8:
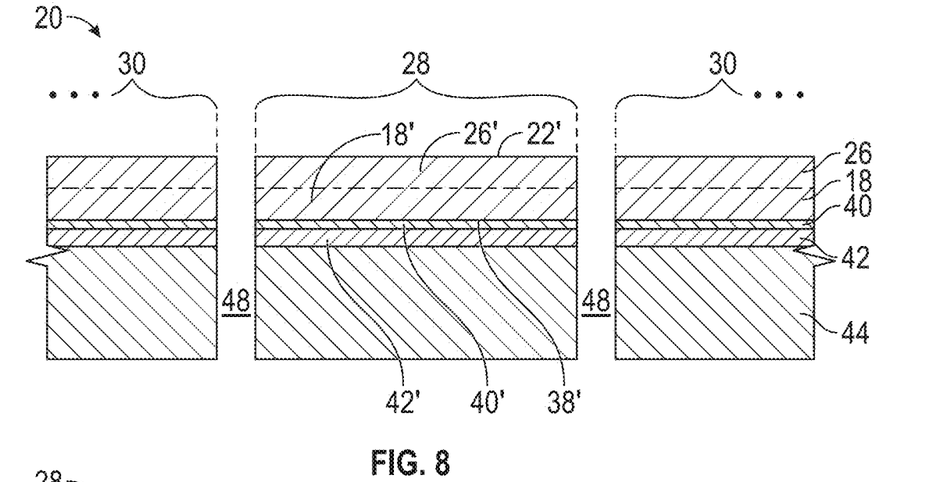
FIG. 8 is a simplified cross-sectional view of the device wafer shown in FIGS. 1-7 following singulation to yield a plurality of semiconductor dies each having a die body over which an ultra-thin wafer backmetal system is formed.

With continued reference to FIG. 8, and as labeled exclusively for the centrally-depicted semiconductor die 28, a prime symbol (') is appended to those structural elements of the singulated die 28, 30 formed from a singulated piece or portion of the ultra-thin device wafer 20 following wafer singulation. In this regard, each singulated die 28, 30 may be described as containing a die body 20', which is a singulated piece of the ultra-thin device wafer 20. Further, the die body 20' of each singulated die 28, 30 may be described as having a die frontside 22', an opposing die backside 24', a frontside region 18' in which at least one IC is formed, and a Si-containing backside region 24', which are comprised of singulated pieces or portions of wafer frontside 22, wafer backside 24, frontside region 18, and backside region 24, respectively. As the dies 28, 30 are created by singulation of the ultra-thin device wafer 20, each die body 20' has an average thickness less than 101.6 µm. Each singulated die 28, 30 further includes a die backmetal system 40', 42', which is comprised of a singulated piece of the wafer-level backmetal system 40, 42. Finally, each die backmetal system 40', 42' includes a die-level Au-based ohmic bond layer 40' and a die-level Si ingress-resistant plated layer 42', which are formed from a singulated piece or portion of the wafer-level Au-based ohmic bond layer 40 and the wafer-level Si ingress-resistant plated layer 42, respectively.

The foregoing description pertaining to the thicknesses and compositions of the layers forming the wafer-level backmetal system 40, 42 apply equally to the layers forming the die backmetal system 40', 42' contained in the singulated dies 28, 30. Thus, in keeping with the foregoing description, the Au-based ohmic bond layer 40' may be predominately composed of Au, if not consistent essentially of Au. The average thickness of the Au-based ohmic bond layer 40' may range from 1 to 10 kÅ and, perhaps, range from about 3 to about 5 kÅ in embodiments. Comparatively, the Si ingress-resistant plated layer 42' may be predominately composed of any number of metallic constituents (including those previously listed); and, in at least some implementations, may be predominately composed of Au, by weight, while having a lower Au purity than does the ohmic bond layer 40'. Further, the Si ingress-resistant plated layer 42' may have an average thickness equal to or greater than the Au-based ohmic bond layer 40' and/or may have a thickness ranging from about 5 to about 20 kÅ in embodiments. Further, as previously described, the Si ingress-resistant plated layer 42' may be deposited, while controlling electroplating parameters (and bath chemistry) such that the plated layer 42' has an average grain size at least twice, if not at least ten times the average grain size of the Au-based ohmic bond layer 40'.

After separation into individual units, the semiconductor die 28, 30 may be mounted onto selected substrates and ultimately integrated into larger devices (e.g., systems, packages, or assemblies) when so desired. Focusing on the centrally-depicted semiconductor die 28 as example, the semiconductor die 28 may be mounted to a substrate, such as an electrically-conductive base flange, whether by the same manufacturing entity that performed the above-described wafer fabrication process or by a different manufacturing entity. An example of such an electrically-conductive base flange 50 is partially shown in FIG. 9, with arrows 52 denoting one manner in which the die 28 may be seated or positioned in a body of a die bond precursor material 54 previously deposited on the upper surface of the base flange 50. The die bond precursor material 54 usefully assumes the form of a sinter precursor material and is thus referred to hereafter as the "sinter precursor material 54." It is emphasized, however, that other types of bond materials (and precursor materials from which such bond materials are formed) can be utilized to attach the semiconductor die 28 to the base flange 50 including, but not limited, solders and electrically-conductive die attach materials, such as metal particle-filled epoxies. Further, while shown as deposited onto the upper surface or frontside of the base flange 50 in the illustrated example, the sinter precursor material 54 can instead be applied to the semiconductor die 28 itself (e.g., applied to the outer terminal surface 56 of the Si ingress-resistant plated layer 42' by dipping, brushing, or the like) prior to positioning the die 28 on the base flange 50 in further embodiments. Additional description of the sinter precursor material 54, and processes suitable for transforming the sinter precursor material 54 into a sintered bond layer, is set-forth below. First, however, a general description of the example base flange 50 is provided, noting that the semiconductor die 28 can be mounted to other types of substrates (e.g., a PCB) in further embodiments.

Figure 9:
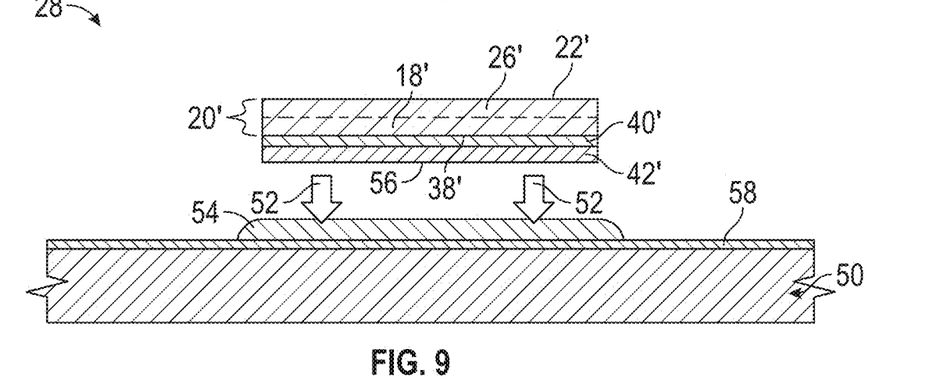
FIGS. 9 and 10 are simplified cross-sectional views illustrating one manner in which one of the semiconductor dies shown in FIG. 8 may be bonded to a substrate, such as an electrically-conductive base flange, utilizing a low temperature sintering process to yield a microelectronic assembly.

The example base flange 50 can be realized as a body of material, a layered or laminated structure, or other substrate suitable for supporting the semiconductor die 28 and, perhaps, one or more additional semiconductor dies hidden from view in FIG. 9. Additionally, the base flange 50 may serve as a heatsink and/or an electrically-conductive terminal when microelectronic assembly 64 is integrated into certain microelectronic devices, such as the Doherty PA package described below in connection with FIGS. 12 and 13. By way of example, the base flange 50 may assume the form of a monolithic metallic structure, plate, or slug in certain implementations. In other implementations, the base flange 50 may have a multilayer metallic construction; e.g., the base flange 50 may contain multiple thermally-conductive layers, which are bonded in a stacked or laminated arrangement. Often, the base flange 50 will be composed predominately of one or more metals having relatively high thermal conductivies, such as copper (Cu). As a more specific example, in an embodiment wherein the base flange 50 is a layered or laminated structure, the base flange 50 may include at least one Cu layer combined with at least one disparate metal layer having a Coefficient of Thermal Expansion (CTE) less than that of the Cu layer. The disparate metal layer may be composed of, for example, Molybdenum (Mo), a Mo—Cu alloy, or a Mo—Cu composite material. In this manner, base flange 50 may be imparted with both a relatively high thermal conductivity and a lower effective CTE. In embodiments, the base flange 50 may include an upper plated layer 58 to enhance bonding; however, this is not required in all embodiments.

In the illustrated example, and as previously noted, a body of sinter precursor material 54 is dispensed or otherwise applied onto the upper surface of the base flange 50 at the location at which the semiconductor die 28 is desirably mounted. The sinter precursor material 54 can be applied utilizing either a wet state or dry state application technique. Wet state application techniques suitable for application of the sinter precursor material 54 include, but are not limited to, screen or stencil printing, doctor blading, spraying, and fine needle dispense techniques. In addition to metal particles of the type described below, the wet state sinter precursor material 54 may contain other ingredients (e.g., a solvent and/or surfactant) to facilitate wet set application, to adjust the viscosity of the precursor material, to prevent premature agglomeration of the metal particles, or to serve other purposes. In one embodiment, the wet state sinter precursor material 54 contains metal particles in combination with a binder (e.g., an epoxy), a dispersant, and a thinner or liquid carrier. The volume of solvent or liquid carrier contained within the sinter precursor material 54 can be adjusted to tailor the viscosity of the sinter precursor material 54 to the selected wet state application technique. For example, in an implementation in which the precursor material 54 is desirably applied by screen printing or doctor blading, the sinter precursor material 54 may contain sufficient liquid to create a paste, slurry, or paint. After application of the wet state sinter precursor material 54, a drying process can be carried-out to remove excess liquid from the bond layer precursor material, if so desired. In further embodiments, the sinter precursor material 54 can be applied utilizing a dry state application technique. In this case, the sinter precursor material 54 can be applied utilizing a film transfer process or other dry state application technique can be utilized to apply the precursor material onto the base flange 50.

Regardless of whether the sinter precursor material 54 (FIG. 9) is applied in a wet or dry state, the metal particles dispersed within the sinter precursor material 54 can have any composition, shape, and size enabling the particles to form a substantially coherent adhesive layer pursuant to the below-described sintering process. In one embodiment, the sinter precursor material 54 contains Au, Ag, or Cu particles, or a mixture thereof. In another embodiment, the metal particles contained within the sinter precursor material 54 consist essentially of Ag or Cu particles. The metal particles contained within the precursor material 54 may or may not be coated with an organic material. For example, in some implementations, the metal particles may be coated with an organic dispersant, which prevents or minimizes physical contact between the particles to inhibit premature agglomeration and particle sintering. When present, any such organic particle coating may be burned away or thermally decomposed, whether in whole or in part, during the below-described metal sintering process. In still further embodiments, other material systems amenable to low temperature sintering, whether currently known or later developed, may be utilized in the fabrication process.

The metal particles contained within the sinter precursor material 54 (FIG. 9) can have any shape or combination of shapes including, but not limited to, spherical shapes, oblong shapes, and platelet or laminae shapes. The average dimensions of the metal particles will vary in conjunction with particle shape and process parameters. However, in general, the average maximum dimension of the metal particles (e.g., the diameter of the metal particles when spherical or the major axis of the metal particles when oblong) may be between about 100 µm and about 10 nanometers (nm) in an embodiment. In other embodiments, the metal particles may have average maximum dimensions greater than or less than the aforementioned range. In certain implementations, a mixture of metal particles having average maximum dimensions in both the nanometer and micron range may be present within the precursor material. In other implementations, only nanoparticles (that is, particles having average maximum dimensions between 1 and 1000 nm) may be contained within the sinter precursor material 54. As a specific, albeit non-limiting example, the sinter precursor material 54 may contain at least one of Ag Au, or Cu nanoparticles or micron-sized particles in an embodiment, with Ag or Cu nanoparticles preferred.

Figure 10:
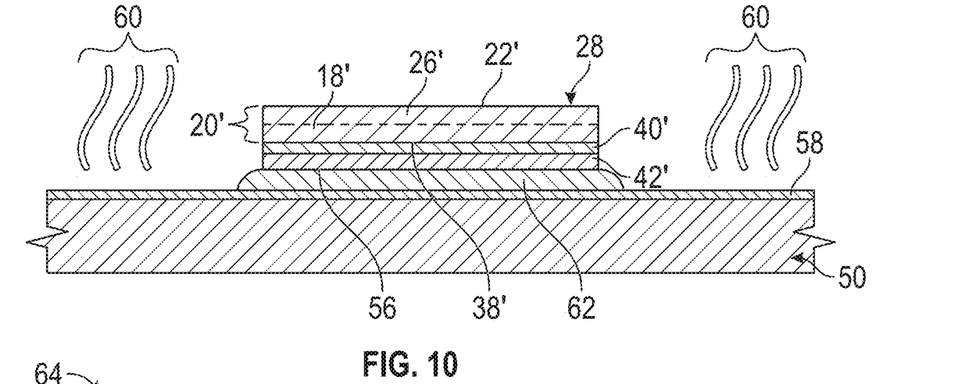

After application of the sinter precursor material 54, the semiconductor die 28 is seated onto the base flange 50 such that the outermost surface of the die-level backmetal system 40', 42' (e.g., the outer principal surface of the Si ingress-resistant plated layer 42') is brought into physical contact with the puddle or body of the sinter precursor material 54. A sintering process is then carried-out by the controlled application of heat, pressure, or combination thereof. For example, in embodiment, a low temperature sintering process may be conducted to transform the sinter precursor material 54 (FIG. 9) into the sintered bond layer 62 (FIG. 10). Such a "low temperature" sintering process may be performed during which the peak processing temperatures are maintained below a peak processing temperature $T_{MAX}$. $T_{MAX}$ is preferably less than 300° C. and, perhaps, less than or equal to about 250° C. in embodiments. In many cases, $T_{MAX}$ will also be significantly less than the melt point of the metal particles contained within the sinter precursor material 54 and, perhaps, less than one half the melt point of the particles considered on an absolute temperature scale (in Kelvin). In still further embodiments, $T_{MAX}$ may vary during the sintering process (that is, a multistage heating schedule may be followed), providing that $T_{MAX}$ (in conjunction with the other process parameters) is sufficient to induce sintering of the metal particles without liquefaction thereof. Additionally, in at least some implementations, a controlled convergent pressure may be applied across the semiconductor die 28 and the electrically-conductive base flange 50 during the sintering process. Generally, then, the low temperature sintering process can be carried-out under any process conditions suitable for transforming the sinter precursor material 54 (FIG. 9) into the sintered bond layer 62 (FIG. 10). The sintering process may be performed with or without pressure, with or without heating (although some degree of elevated heat will typically be applied), and in any suitable atmosphere (e.g., open air or in the presence of an inert gas, such as nitrogen).

When produced utilizing the above-described metal sintering process, the sintered bond layer 62 may be predominately composed of one or more sintered metals. Again, the sintered bond layer 62 may or may not contain organic materials. In one embodiment, the sintered bond layer 62 may consist essentially of one or more metals (e.g., essentially pure Cu or essentially pure Ag) and are essentially free of organic material; that is, contain less than 1% weight of organic materials. In other embodiments, the sintered bond layer 62 may contain resin or other organic fillers. For example, in another implementation, the sintered bond layer 62 may contain organic materials that increase pliability, such as an epoxy, to reduce the likelihood of crack formation and propagation across thermal cycles. Depending upon the desired final composition of the sintered bond layer 62, the parameters of the sintering process may be controlled to decompose organic materials from the sinter precursor material 54, in whole or in part Additionally, the sintered bond layer 62 may be produced to have a desired porosity, which may range from 0% to 30% by volume in an embodiment. In another embodiment, the sintered bond layer may be formed to have a porosity of less than 1% and, perhaps, less than 0.5% by volume. Finally, the thickness of the sintered bond layer 62 will vary amongst embodiments, but may range from about 5 µm to about 100 µm and, preferably, may range from about 15 µm to about 146 µm in an example and non-limiting embodiment.

Different bond materials and techniques may be utilized to form the desired attachment including, for example, low temperature sinter attachment. Generally, when employing such a low temperature sinter attachment process, the Si ingress-resistant plated layer is placed in contact with a sinter precursor material, which further contacts a substrate (e.g., an electrically-conductive flange) opposite the Si ingress-resistant plated layer. The sinter precursor material may then be cured (e.g., by exposure to a heating schedule) to a maximum processing temperature to convert the sinter precursor material to a sintered bond layer bonding and electrically coupling the Si ingress-resistant plated layer to the substrate (e.g., electrically-conductive flange). Pressure may also be applied, if desired. Such a sintering process thus results in the formation of low stress, mechanically-robust, solid state metallurgical diffusion bonds at the bond joint interfaces between the die-level backmetal system 40', 42', the sintered bond layer 62, and the base flange 50.

Figure 11:
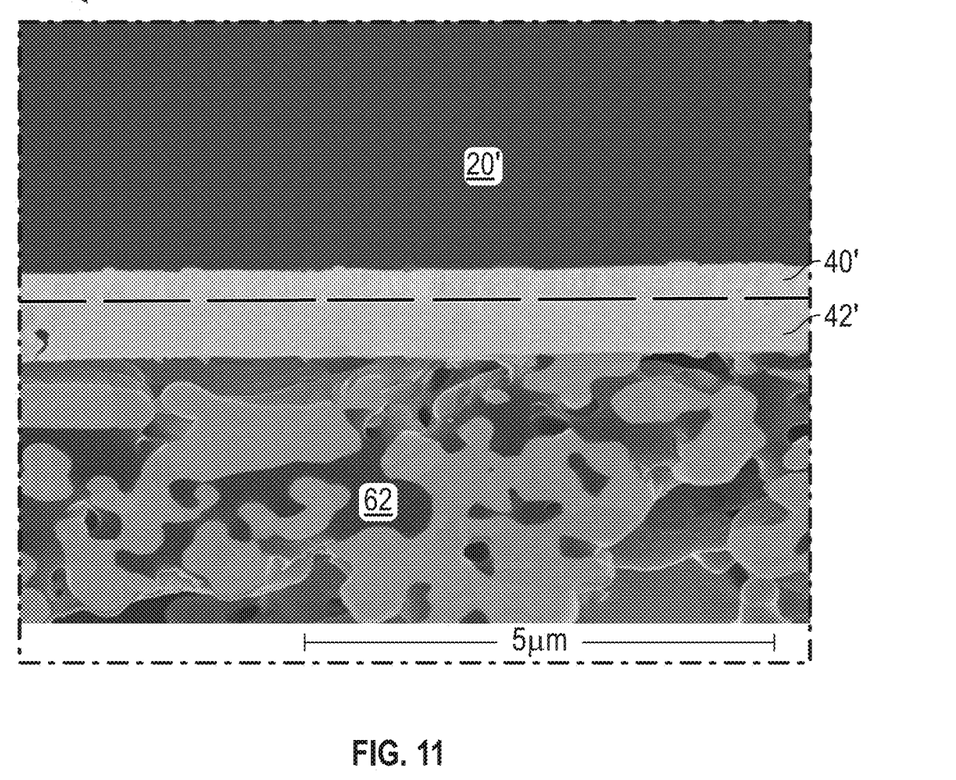
FIG. 11 is a focused ion beam or scanning electron microscope image encompassing a region of a microelectronic assembly corresponding to that shown in FIGS. 9 and 10, but reduced to practice in accordance with an example embodiment of the present disclosure.

FIG. 11 is a focused ion beam or scanning electron microscope image encompassing a region of a microelectronic assembly analogous to that shown in FIGS. 9 and 10, but reduced to practice in accordance with a further example embodiment of the present disclosure. Reference numerals are carried-over to denote like structural features, with a dashed line superimposed at the interface between the die-level Au-based ohmic bond layer 40' and the die-level Si ingress-resistant plated layer 42' to more clearly demarcate this boundary. Here, it can be seen that an intervening layer of SiO (which would otherwise appear in the image as a thin gray line) is absent at the interface or boundary between the die-level Si ingress-resistant plated layer 42' and the sintered bond layer 62. In this manner, the semiconductor die 28 is mounted to the electrically-conductive base flange 50 in a manner providing high strength, delamination resistant bonds throughout the material stack between the die 28 and the base flange 50; the material stack consisting of the die-level Au-based ohmic bond layer 40', the die-level Si ingress-resistant plated layer 42', and the sintered bond layer 62. Concurrently, a robust, low resistance electrical path and a highly conductivity thermal path is created between the semiconductor die 28 and the electrically-conductive base flange 50. This is advantageous, particularly when the resulting microelectronic assembly 64 is integrated into certain types of high performance (e.g., RF) microelectronic devices, such as a Doherty PA device (package or module) as further discussed below.

Figure 12:
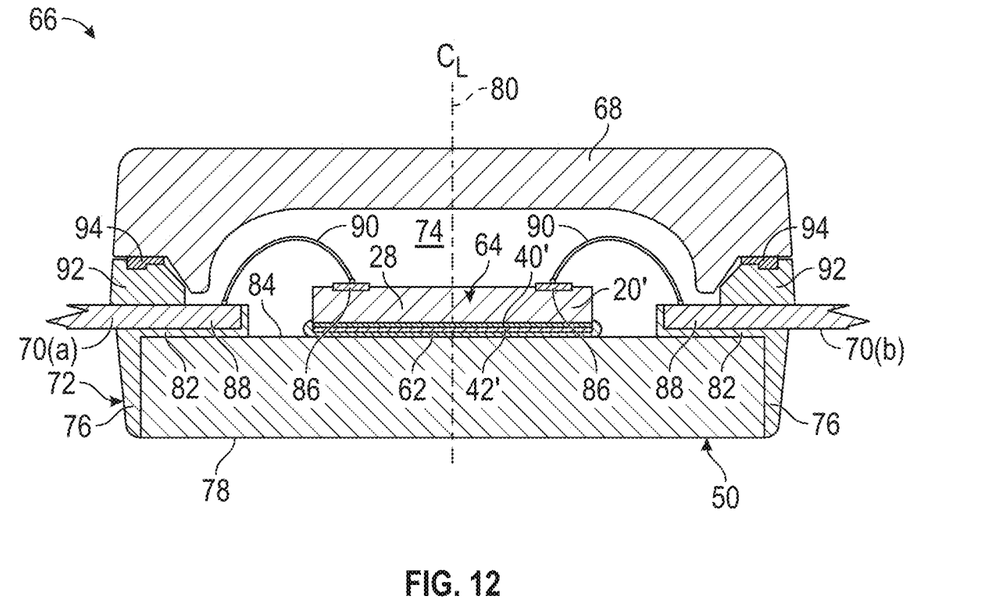
FIGS. 12 and 13 are cross-sectional and cross-sectional isometric views, respectively, illustrating an example microelectronic device (here, a Doherty PA package) into which the microelectronic assembly shown in FIGS. 9 and 10 is suitably incorporated.
Figure 13:
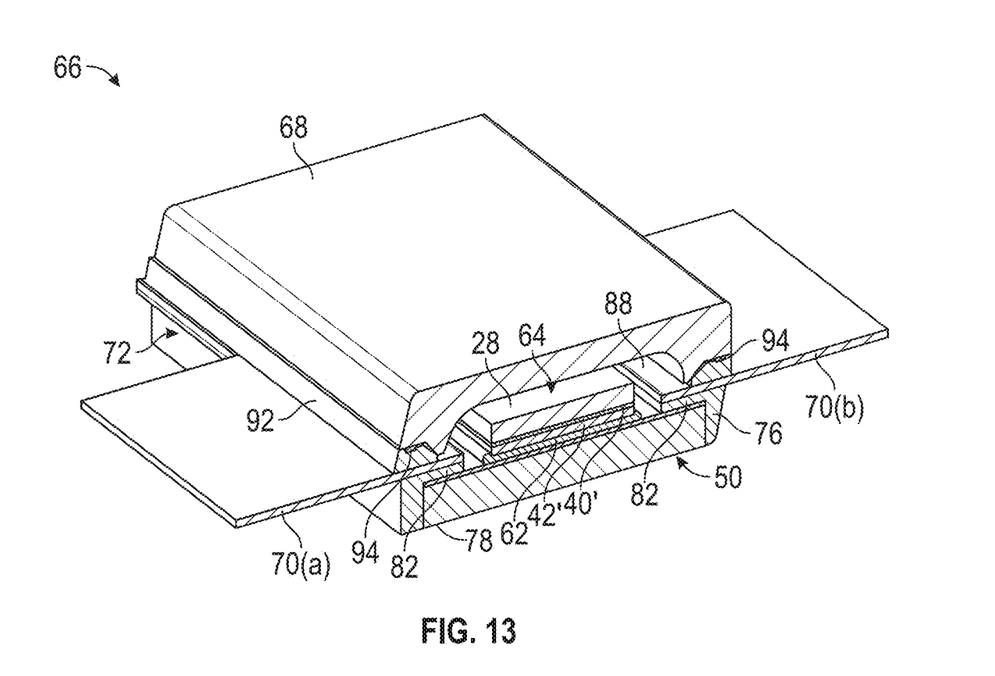

FIGS. 12 and 13 are cross-sectional and cross-sectional isometric views, respectively, illustrating an example microelectronic device (here, a Doherty PA package 66) into which the microelectronic assembly 64 shown in FIGS. 9 and 10 can be incorporated in certain embodiments of the present disclosure. In this particular example, the Doherty PA package 66 assumes of the form of a molded air cavity package. However, the Doherty PA package 66 may assume other forms in alternative implementations, such as an enclosed package lacking any gas-containing cavity, an air cavity package constructed utilizing a window frame approach, and/or a microelectronic package containing a different lead type (e.g., a no-lead package or a gullwing package). Progressing from top to bottom in FIGS. 12 and 13, the Doherty PA package 66 includes a lid or cover piece 68, a plurality of package leads 70, a molded package body 72, and the base flange 50 on and around which the package body 72 is formed. Additionally, the example Doherty PA package 66 contains an air cavity 74, which is principally bound and defined by the cover piece 68, the molded package body 72, and the base flange 50. While referred to as an "air cavity" by industry standards, the air cavity 74 may contain air, another inert gas, or a gas mixture, and may or may not be partially evacuated or pressurized relative to the ambient environment. The hermicity of air cavity 74 will vary amongst embodiments, although the Doherty PA package 66 is usefully produced such that relatively little, if any leakage occurs between the air cavity 74 and the ambient environment.

The molded package body 72 can be formed to have various different geometries and structural features. In the illustrated example, the molded package body 72 is formed to include a bottom edge portion or lower peripheral skirt 76; the terms "lower," "bottom," and similar terms of orientation defined based upon proximity to the bottom principal surface or backside 78 of the base flange 50. The lower peripheral skirt 76 is bonded to and extends around the base flange 50, as taken about the centerline 80 of the Doherty PA package 66. The bottom principal surface or backside 78 of the base flange 50 is exposed through a lower central opening, which is provided in the molded package body 72 and which is peripherally bound by the lower peripheral skirt 76. By exposing the flange backside 78 from the exterior or underside of the Doherty PA package 66 in this manner, mounting or attachment of the Doherty PA package 66 within a larger system or device may be eased, while electrical connection to the flange backside 78 may be facilitated as may be useful when, for example, the flange 50 serves as a terminal of the package 66. As another benefit, the exposed region of the flange backside 78 may promote heat removal from the Doherty PA package 66 by conductive heat transfer through the base flange 50. The foregoing benefits are generally optimized when at least a majority, if not the substantial entirety of the flange backside 78 (considered by surface area) is exposed through the peripheral skirt 76 of the molded package body 72, as shown.

With continued reference to FIGS. 12 and 13, the molded package body 72 also contains one or more inwardly-extending ledge portions, referred to hereafter as "lead isolation shelves 82." The lead isolation shelves 82 underlie inner terminal end portions of the package leads 70, which extend into the package interior, are exposed within the air cavity 74, and to which device interconnections are formed. The lead isolation shelves 82 serve, in effect, as intervening dielectric layers, which reside between the respective lower surfaces of the package leads 70 and the flange frontside or upper surface 84 (FIG. 12), as taken vertically through Doherty PA package 66 along the package or device centerline 80. The lead isolation shelves 82 thus provide lead-flange electrical insulation, while further helping to mechanically join the package leads 70 and the base flange 50. Finally, the lead isolation shelves 82 may surround the peripheral surfaces of the inner lead end portions 88, while leaving exposed the upper surfaces of the inner lead end portions 88 from within the package interior for subsequent electrical interconnection.

The Doherty PA package 66 contains the semiconductor die 28 includes a lower surface or backside, which is attached to flange frontside 84 by at least one sintered bond layer 62, as previously described. As shown exclusively in FIG. 12, a number of bond pads 86 present on the frontside of the die 28 can be electrically interconnected with the exposed inner portions 88 of the package leads 70 utilizing, for example, a number of wire bonds 90. In alternative implementations, another interconnection approach may be employed to electrically the interconnect bond pads 86 of the semiconductor die 28 with corresponding package terminals. A first lead 70(*a*) projects from a first side of the Doherty PA package 66 and serves as an input lead electrically coupled to the input (e.g., gate) terminal of the semiconductor die 28; while a second lead 70(*b*) projects from a second, opposing side of the package 66 and serves as an output lead electrically coupled to the output (e.g., drain) terminal of the semiconductor die 28. In certain instances, the base flange 50 may itself serve as a ground terminal of the Doherty PA package 66 and, therefore, may be electrically coupled to a source terminal of the semiconductor die 28; specifically, the base flange 50 may be electrically coupled to the source region(s) of one or more peaking or carrier transistors formed in the die 28. The semiconductor die 28 is electrically coupled to the base flange 50 through the die-level backmetal system 40', 42' and through the sintered bond layer 62.

While only a single semiconductor die 28 is visible in the illustrated example, the Doherty PA package 66 can contain any number and type of microelectronic devices operably coupled utilizing various interconnection schemes. For example, in a further implementation, the Doherty PA package 66 may contain two or more semiconductor dies 28 electrically coupled in series or parallel between any practical number of package leads. As a more specific example, the Doherty PA package may contain a first semiconductor die (e.g., the die 28) serving a peaking die bearing a peaking transistor IC and electrically coupled between the package leads 70(*a*), (*b*). Additionally, the Doherty PA package 66 may further contain a second (or perhaps more) semiconductor die serving as a carrier die bearing a carrier transistor and electrically coupled between additional sets of package leads hidden from view in the cross-sections of FIGS. 12 and 13. Further, various additional integrated passive devices or Surface Mount Device(s) (e.g., capacitors) may be incorporated into the Doherty PA package 66 to provide other functionalities, such as impedance matching on the input and/or output sides of the packaged dies. After installation of the semiconductor die 28 (and other circuit elements), and interconnection of the semiconductor die 28 with the package leads, the cover piece 68 is positioned over molded package body 72 and bonded to an upper peripheral edge portion 92 of the package body 72 to sealingly enclose the air cavity 74. Specifically, the lower peripheral edge of the cover piece 68 may be bonded to an upper peripheral edge portion 92 of the molded package body 72 by a ring of bond material 94 to yield a substantially gas-tight seal around the periphery of the cover-body interface.

CONCLUSION

There has thus been provided semiconductor dies including ultra-thin wafer backmetal systems and microelectronic devices (e.g., Doherty PA devices) containing such semiconductor dies, as well as methods for manufacturing such microelectronic devices and semiconductor dies by wafer processing. The ultra-thin wafer backmetal systems are well-suited for formation over ultra-thin (<4 mil or 101.6 μm) device wafers, which are singulated to yield a plurality of dies subsequently mounted to electrically-conductive base flanges (or other substrates) utilizing, for example, a low temperature sinter attach process. The ultra-thin wafer backmetal systems not only provide high strength, high thermal conductivity, low electrical resistivity bonds between the Si-containing die backside and the die bond material (e.g., sintered bond material) utilized to attach the die to the selected substrate (e.g., a base flange flange), but further reduce or eliminate diffusion of Si through the backmetal metal system to inhibit SiO formation at elevated temperatures; e.g., at maximum processing temperatures approaching or exceeding 200° C. occurring when a sinter attach process is utilized to join the die to a base flange or other substrate.

Embodiments of the ultra-thin wafer backmetal system provide such beneficial features due, at least in part, to the usage of a sputter-deposited Au-based ohmic contact layer in combination with an Si ingress-resistant plated layer, which is electroplated under process conditions imparting the plated layer with an increased grain size (and therefore a decreased amount of grain boundaries) as compared to the ohmic contact layer. In certain embodiments, the ultra-thin wafer backmetal system may consist essentially of these two layers, in which case the Au-based ohmic contact layer may first be sputter-deposited directly onto the backside of the semiconductor die body, followed by electroplating of the Si ingress-resistant plated layer directly onto the Au-based ohmic contact layer. In other embodiments, the ultra-thin wafer backmetal system may include additional layers, such as a Ti-containing barrier layer (e.g., a TiNiVAu barrier layer) for increased Si ingress, but with a tradeoff in lower electrical conductivity (and, thus, lower gain and efficiency when the semiconductor die and backmetal systems are incorporated into a high performance RF device). In still other embodiments, the ultra-thin wafer backmetal system may be essentially free of Cr, Ti, W, Ni, and V.

As indicated above, the foregoing has provided methods for processing a device wafer to produce a plurality of semiconductor dies having backmetal systems thereon. In various embodiments, the method for processing a device wafer includes the step or process of obtaining a device wafer having a wafer frontside and a wafer backside opposite the wafer frontside, whether the device wafer is obtained by purchase from a supplier, by independent fabrication, or in some other manner. A wafer-level Au-based ohmic bond layer, which has a first average grain size and which is predominately composed of Au, by weight, is sputter deposited onto the wafer backside, the wafer-level Au-based ohmic bond layer. An electroplating process is then utilized to deposit a wafer-level Si ingress-resistant plated layer over the wafer-level Au-based ohmic bond layer, while imparting the wafer-level Si ingress-resistant plated layer with a second average grain size exceeding the first average grain size. Lastly, the device wafer is singulated to separate the device wafer into a plurality of semiconductor die each having a die frontside formed from a portion of the wafer frontside, an Au-based ohmic bond layer formed from a portion of the wafer-level Au-based ohmic bond layer, and an Si ingress-resistant plated layer formed from a portion of the wafer-level Au-based ohmic bond layer. In certain embodiments, the method may further include the steps or processes of: (i) formulating the wafer-level Si ingress-resistant plated layer to be predominately composed of Au, by weight, while having a lower Au content than does the wafer-level Au-based ohmic bond layer; and/or (ii) formulating the wafer-level Si ingress-resistant plated layer to be predominately composed of Au, Ag, Pd, Pt, or a combination thereof, by weight.

Methods for fabricating die-containing microelectronic devices, such as Doherty PA devices, have also been provided. In an embodiment, the method includes the step or process of obtaining a semiconductor die comprising a die backside, an Au-based ohmic bond layer formed on the die backside, and a Si ingress-resistant plated layer formed on the Au-based ohmic bond layer, with the Si ingress-resistant plated layer having an average grain size exceeding that of the Au-based ohmic bond layer. The semiconductor die may be obtained by purchase from a supplier, by independent fabrication (e.g., using the method set-forth in the previous paragraph), or obtained in another manner. The semiconductor die is then placed on a substrate (e.g., an electrically-conductive base flange) having an upper surface. Before, after, or concurrent with placement of the semiconductor die on the substrate, applying a sinter precursor material at an interface between the semiconductor die and the upper surface of the substrate. The sinter precursor material is then sintered or cured at a maximum process temperature (e.g., a maximum process temperature less than 300° C.) to transform the sinter precursor material into a sintered bond layer contacting the Si ingress-resistant plated layer and bonding the semiconductor die to the substrate. Further, in certain implementations in which the substrate assumes the form of an electrically-conductive base flange, while the semiconductor die carries a transistor, the method may further include the step or process of electrically coupling a source region of the transistor to the electrically-conductive base flange through the Au-based ohmic bond layer, the Si ingress-resistant plated layer, and the sintered bond layer.

Embodiments of microelectronic device, such as Doherty PA devices, have further been provided. In various implementations, the microelectronic device includes (i) a semiconductor die having a die frontside and a die backside opposite the die frontside; (ii) a backmetal system; (iii) a substrate having an upper surface; and (iv) a die bond material bonding the semiconductor die to the upper surface of the substrate. The backmetal system includes, in turn, an Au-based ohmic bond layer overlying the die backside, and a Si ingress-resistant plated layer overlying the Au-based ohmic bond layer. The Si ingress-resistant plated layer has an average grain size exceeding that of the Au-based ohmic bond layer. In certain embodiments, the die bond material may be a sintered material; the semiconductor die may be imparted with a thickness less than 101.6 μm (as when formed from a singulated piece of an ultra-thin wafer); the ingress-resistant plated layer may be predominately composed of Au, silver, palladium, platinum, or a combination thereof, by weight; and/or the second average grain size may be at least ten times the first average grain size. Additionally or alternatively, in embodiments in which the Au-based ohmic bond layer to consists essentially of Au, the ingress-resistant plated layer may be predominately composed of Au, by weight, while having a lower Au content than does the wafer-level Au-based ohmic bond layer. As a still further possibility, the Au-based ohmic bond layer may be formed in direct contact with the die backside, while the Si ingress-resistant plated layer is formed in direct contact with the Au-based ohmic bond layer.

While at least one example embodiment has been presented in the foregoing Detailed Description, it should be appreciated that a vast number of variations exist. It should also be appreciated that the example embodiment or example embodiments are only examples, and are not intended to limit the scope, applicability, or configuration of the invention in any way. Rather, the foregoing Detailed Description will provide those skilled in the art with a convenient road map for implementing an example embodiment of the invention. It being understood that various changes may be made in the function and arrangement of elements described in an example embodiment without departing from the scope of the invention as set forth in the appended claims.

What is claimed is:

1. A microelectronic device, comprising:
   a semiconductor die having a die frontside and a die backside opposite the die frontside;

a backmetal system, comprising:
a gold-based ohmic bond layer overlying the die backside, and
a silicon (Si) ingress-resistant plated layer overlying the gold-based ohmic bond layer, the Si ingress-resistant plated layer having an average grain size exceeding that of the gold-based ohmic bond layer;
a substrate having an upper surface, wherein at least a portion of the Si ingress-resistant plated layer is disposed between the semiconductor die and the upper surface of the substrate; and
a die bond material bonding the semiconductor die to the upper surface of the substrate.

2. The microelectronic device of claim 1 wherein the die bond material comprises a sintered material.

3. The microelectronic device of claim 1 wherein the semiconductor die has a thickness less than 101.6 microns.

4. The microelectronic device of claim 1 wherein:
the gold-based ohmic bond layer consists essentially of gold, and
the Si ingress-resistant plated layer is predominately composed of gold, silver, palladium, platinum, or a combination thereof, by weight, while having a lower gold content than does the wafer-level gold-based ohmic bond layer.

5. The microelectronic device of claim 1 wherein the second average grain size is at least ten times the first average grain size.

6. The microelectronic device of claim 1 wherein the gold-based ohmic bond layer is formed in direct contact with the die backside; and
wherein the Si ingress-resistant plated layer is formed in direct contact with the gold-based ohmic bond layer.

7. A microelectronic device, comprising:
a semiconductor die having a die frontside and a die backside opposite the die frontside;
a gold-based ohmic bond layer on the die backside, the gold-based ohmic bond layer having a first average grain size and predominately composed of gold, by weight;
a silicon (Si) ingress-resistant plated layer on the wafer-level gold-based ohmic bond layer, wherein the Si ingress-resistant plated layer has a second average grain size exceeding the first average grain size; and
a substrate having an upper surface, wherein at least a portion of the Si ingress-resistant plated layer is disposed between the semiconductor die and the upper surface of the substrate.

8. The microelectronic device of claim 7 wherein the gold-based ohmic bond layer consists essentially of gold.

9. The microelectronic device of claim 7 wherein the Si ingress-resistant plated layer is predominately composed of gold, by weight, while having a lower gold content than does the gold-based ohmic bond layer.

10. The microelectronic device of claim 7 wherein the Si ingress-resistant plated layer is predominately composed of gold, silver, palladium, platinum, or a combination thereof, by weight.

11. The microelectronic device of claim 7 wherein the second average grain size is at least ten times the first average grain size.

12. The microelectronic device of claim 7 wherein the gold-based ohmic bond layer has an average thickness ranging from 1 to 10 kilo angstroms.

13. The microelectronic device of claim 12 wherein:
the gold-based ohmic bond layer has an average thickness ranging from 3 to 5 kilo angstroms; and
the Si ingress-resistant plated layer has an average thickness equal to or greater than the wafer-level gold-based ohmic bond layer.

14. The microelectronic device of claim 7 further comprising:
a substrate; and
a sintered bond layer attaching the semiconductor die to the substrate.

15. A microelectronic device, comprising:
a semiconductor die comprising a die backside, a gold-based ohmic bond layer formed on the die backside, and a silicon (Si) ingress-resistant plated layer formed on the gold-based ohmic bond layer, the Si ingress-resistant plated layer having an average grain size exceeding that of the gold-based ohmic bond layer;
a substrate having an upper surface, wherein at least a portion of the Si ingress-resistant plated layer is disposed between the semiconductor die and the upper surface of the substrate; and
a sintered bond layer contacting the Si ingress-resistant plated layer and bonding the semiconductor die to the substrate.

16. The microelectronic device of claim 15 wherein:
the substrate comprises an electrically conductive base flange;
the semiconductor die comprises a transistor; and
a source region of the transistor is electrically coupled to the electrically-conductive base flange through the gold-based ohmic bond layer, the Si ingress-resistant plated layer, and the sintered bond layer.

17. The microelectronic device of claim 15 wherein the gold-based ohmic bond layer consists essentially of gold.

18. The microelectronic device of claim 15 wherein the Si ingress-resistant plated layer is predominately composed of gold, by weight, while having a lower gold content than does the gold-based ohmic bond layer.

19. The microelectronic device of claim 15 wherein the Si ingress-resistant plated layer is predominately composed of gold, silver, palladium, platinum, or a combination thereof, by weight.

20. The microelectronic device of claim 15 wherein the second average grain size is at least ten times the first average grain size.

* * * * *